(12) United States Patent
Fujimori et al.

(10) Patent No.: US 7,396,558 B2
(45) Date of Patent: Jul. 8, 2008

(54) INTEGRATED MASK AND METHOD AND APPARATUS FOR MANUFACTURING ORGANIC EL DEVICE USING THE SAME

(75) Inventors: Shigeo Fujimori, Shiga (JP); Yoshiyuki Kitamura, Shiga (JP); Hiromitsu Kanamori, Shiga (JP); Takeshi Ikeda, Shiga (JP); Tetsuo Oka, Shiga (JP)

(73) Assignee: Toray Industries, Inc. (JP)

( * ) Notice: Subject to any disclaimer, the term of this patent is extended or adjusted under 35 U.S.C. 154(b) by 17 days.

(21) Appl. No.: 10/055,770

(22) Filed: Jan. 23, 2002

(65) Prior Publication Data
US 2002/0102754 A1 Aug. 1, 2002

(30) Foreign Application Priority Data

Jan. 31, 2001 (JP) ............................ 2001-023474
Jan. 31, 2001 (JP) ............................ 2001-023475

(51) Int. Cl.
*B05D 5/06* (2006.01)
(52) U.S. Cl. ........................... 427/66; 427/69; 427/282; 118/721
(58) Field of Classification Search .............. 250/491.1; 118/504, 720, 721, 505; 427/66, 69, 282
See application file for complete search history.

(56) References Cited

U.S. PATENT DOCUMENTS 3,352,282 A * 11/1967 Schweitzer ................. 118/721
4,915,057 A * 4/1990 Boudreau et al. ............ 118/505
5,701,055 A * 12/1997 Nagayama et al. .......... 313/504
5,904,961 A * 5/1999 Tang et al. .................. 427/561
5,978,094 A * 11/1999 Narabe et al. ............... 356/401
6,589,382 B2 * 7/2003 Clark et al. ............... 156/304.3
6,749,690 B2 * 6/2004 Clark .......................... 118/721
2001/0019807 A1 * 9/2001 Yamada et al. .............. 430/139
2002/0190661 A1 * 12/2002 Duggal et al. ............. 315/169.1

FOREIGN PATENT DOCUMENTS

JP 11-158605 6/1999
JP 2000-113978 * 4/2000

* cited by examiner

*Primary Examiner*—Timothy Meeks
*Assistant Examiner*—Jimmy Lin
(74) *Attorney, Agent, or Firm*—DLA Piper US LLP

(57) ABSTRACT

An integrated mask including a plurality of deposition masks, each deposition mask having an array of deposition apertures formed in accordance with a deposition pattern; and a base plate having a plurality of openings on which the deposition masks are arranged is provided. The deposition mass are retained to the base plate by engaging unit in a disengageable manner, and alignment marks used for positioning the deposition masks on the base plate are formed on the base plate. In addition a method and apparatus for fabricating the integrated mask, a method and apparatus for manufacturing an organic EL device using the integrated mask, and an organic EL device are provided.

2 Claims, 7 Drawing Sheets

INTEGRATED MASK AND METHOD AND APPARATUS FOR MANUFACTURING ORGANIC EL DEVICE USING THE SAME

BACKGROUND OF THE INVENTION

1. Technical Field

This disclosure relates to organic EL devices which are able to convert electrical energy into light, and which have various applications in devices such as display devices, flat panel displays, backlights, illuminations, interior decorations, signboards, electronic cameras, timepieces, etc. More specifically, it relates to an integrated mask in which a plurality of deposition masks used for manufacturing the organic EL devices are arranged, and to a method and apparatus for fabricating the integrated mask. In addition, the disclosure also relates to a method and apparatus for manufacturing an organic EL device using the integrated mask.

2. Description of the Related Art

In organic EL devices, light is emitted when electrons supplied from cathodes and holes supplied from anodes are recombined inside an organic layer disposed between the cathodes and the anodes. Organic EL devices are usually used in thin, compact displays because of their simple structure and ability to emit high-intensity, multicolored light at low voltage.

In order to manufacture a full-color display panel using an organic EL device, thin film layers including red, green, and blue (RGB) emitting layers, a first electrode layer (for example, ITO), a second electrode layer (for example, metal), etc., must be regularly formed in a predetermined pattern with a predetermined pitch.

In the above-described thin film layers, in order to form organic thin film layers, for example, emitting layers, in a precise pattern, a mask deposition method is normally applied from the viewpoint of the characteristics of the organic thin film layers. In the mask deposition method, a deposition process is performed in a vacuum using a mask having apertures formed in accordance with a predetermined pattern of the emitting layer.

In order to increase the productivity in manufacturing the organic EL devices, multiple organic EL devices are simultaneously formed on a single, large substrate. This is because a mask deposition used for forming emitting layers is performed in a batch-wise manner, substrate by substrate, and the existing organic EL devices are mainly used in compact apparatuses.

In the case in which multiple organic EL devices are simultaneously formed on a single, large substrate, a deposition mask having a plurality of arrays of apertures, each array corresponding to a single organic EL device, must be prepared. However, in such a case, the size of such a deposition mask is increased, and the deposition mask is greatly deformed in the manufacturing process and the deposition process. Thus, the high dimensional accuracy of the arrays of apertures cannot be maintained sufficiently. Accordingly, an integrated mask in which a plurality of deposition masks, each of which has an array of apertures corresponding to a single organic EL device, are arranged is disclosed in Japanese Unexamined Patent Application Publication No. 2000-113978.

Since three emitting layers corresponding to three colors (RGB) are formed, it is important to accurately adjust the relative positions between the three emitting t layers. Although a method for positioning a single deposition mask relative to a substrate has been suggested (the Japanese Unexamined Patent Application Publication No. 11-158605), a method for positioning an integrated mask relative to a substrate has not been provided. In addition, in an integrated mask, a plurality of deposition masks provided for simultaneously forming multiple organic EL devices must all be accurately positioned.

Accordingly, it could be helpful to have a construction for practically using an integrated mask in which a plurality of deposition masks, each of which has an array of apertures corresponding to an organic EL device, are arranged. In addition, it could be helpful to have a means for fabricating the integrated mask in such a manner that the deposition masks are accurately positioned in the integrated mask. In addition, it could further be helpful to have a method and apparatus for manufacturing an organic EL device by which the integrated mask and a substrate can be accurately positioned, multiple organic EL devices can be formed on a single substrate by a deposition process, and the productivity in manufacturing organic EL devices can be significantly increased. Furthermore, it could be helpful to have a high-quality, inexpensive organic EL device.

SUMMARY

An integrated mask includes a plurality of deposition masks, each deposition mask having an array of deposition apertures formed in accordance with a deposition pattern; and a base plate having a plurality of openings on which the deposition masks are arranged. The deposition masks are retained to the base plate by engaging units in a disengageable manner, and alignment marks used for positioning the deposition masks on the base plate are formed on the base plate. The area of each of the openings formed in the base plate is larger than the area of the array of deposition apertures formed in each of the deposition masks. Preferably, the engaging unit is able to disengage the deposition masks when an external force is applied. For example, each of the engaging units may be constructed of a spring and a member which transmits the spring force. When the external force is not applied, the deposition masks are fixed by the spring force, and when the external force is applied, the member removes the spring force applied to the deposition masks.

In addition, a fabrication apparatus for the integrated mask includes a table which supports the base plate; a deposition mask retaining-and-moving unit which retains the deposition masks and freely moves the deposition masks relative to the base plate; a positioning system which detects the alignment marks or reference positions of the base plate and the deposition masks and adjusts the relative position between the base plate and the deposition masks using the deposition mask retaining-and-moving unit; and disengaging units which disengage the deposition masks and the base plate by applying an external force on the engaging units.

In addition, a fabricating method for the integrated mask includes the steps of supporting the base plate, on which the deposition masks are placed, on a table; detecting the alignment marks or reference positions of the base plate and the deposition masks by means of, for example, an image processing using a CCD camera; and adjusting the relative position between the base plate and the deposition masks by retaining and moving the deposition masks relative to the base plate; and fixing the deposition masks on the base plate using the engaging units after the step of adjusting the relative position.

In addition, an organic EL device manufacturing method includes the steps of positioning the integrated mask of the present invention and a substrate to be subjected to a deposition process in a deposition chamber using the alignment marks of the integrated mask; and patterning a thin film layer in the deposition process using the integrated mask, thereby forming organic EL devices. The step of positioning the integrated mask and the substrate may be performed outside the deposition chamber, and the integrated mask and the substrate may be transferred into the deposition chamber after the positioning process. Thus, the positioning process may be performed at a suitable place in accordance with the arrangement or construction of the apparatus, and the place at which the positioning process is performed not limited as long as the positioning process is performed. In addition, the integrated mask is preferably applied for forming R, G, and B emitting layers.

In addition, an organic EL device manufacturing apparatus includes a positioning apparatus used for positioning the integrated mask of the present invention and a substrate to be subjected to a deposition process using the alignment marks of the integrated mask; and a deposition apparatus used for patterning a thin film layer in the deposition process using the deposition mask. The deposition apparatus includes an evaporation source disposed inside the deposition chamber, and a deposition layer having a pattern corresponding to a pattern of a deposition mask is formed on a substrate in this deposition apparatus. The positioning apparatus used for positioning the integrated mask and the substrate may be disposed inside or outside the deposition chamber. In the case in which the positioning device is disposed outside the deposition chamber, the organic EL device manufacturing apparatus may include a device for transferring the integrated mask and the substrate into the deposition chamber after the positioning.

In the integrated mask, a plurality of deposition masks, each of which having an array of deposition apertures, are arranged using the reference marks of the integrated mask and the deposition masks, and are retained to the base plate by engaging units in a disengageable manner. Accordingly, multiple deposition masks can be disposed at predetermined positions with high accuracy.

In addition, in the method and apparatus for fabricating the integrated mask, the position of the base plate and the positions of the deposition masks are detected, and the relative positions between the base plate and the deposition masks are adjusted using the detection result. Accordingly, an integrated mask having a high accuracy can be fabricated.

In addition, in the method and apparatus for manufacturing the organic EL device, the step of positioning the integrated mask and the substrate and the step of forming a thin film layer, for example, an emitting layer, are performed using the above-described integrated mask having a high accuracy. Accordingly, a thin film layer can be formed in a predetermined patter having high dimensional accuracy, irrespective of the size of the substrate on which the thin film layer is formed. In addition, since multiple organic EL devices can be formed on a single substrate at high accuracy, high quality organic EL devices can be manufactured with high productivity.

Figure 3:
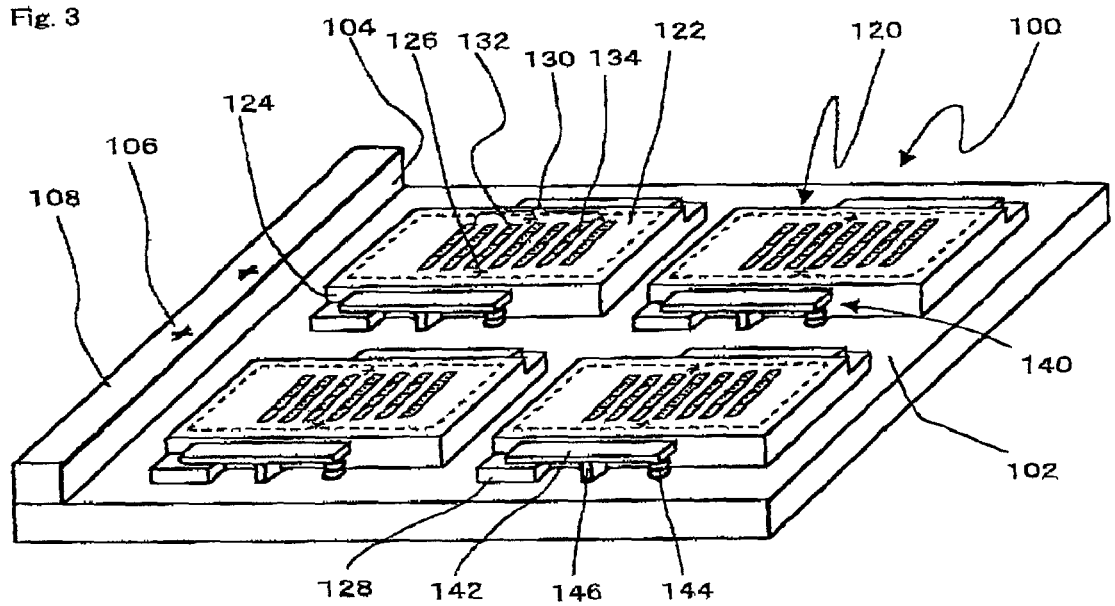
FIG. 3 is a perspective view showing an overall construction of another embodiment of an integrated mask.
Figure 5:
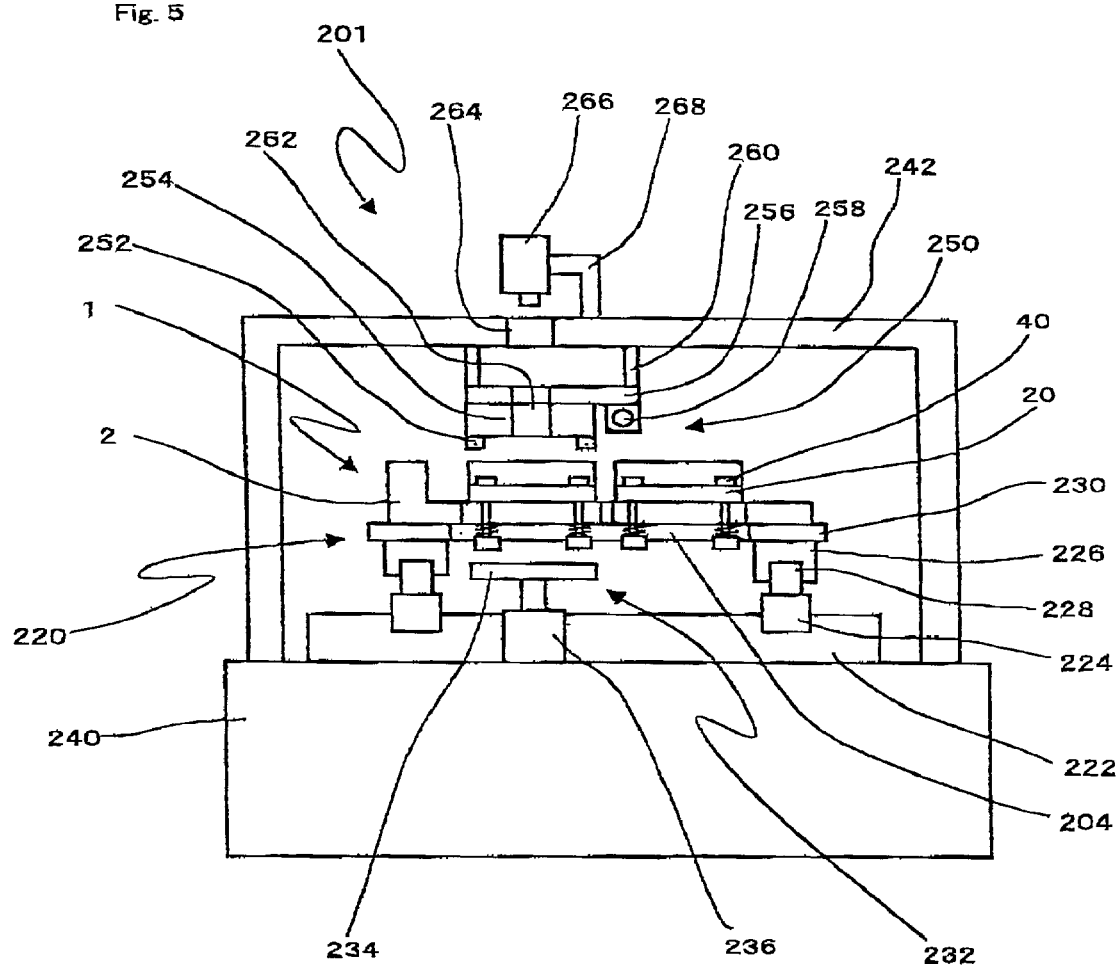
Figure 6:
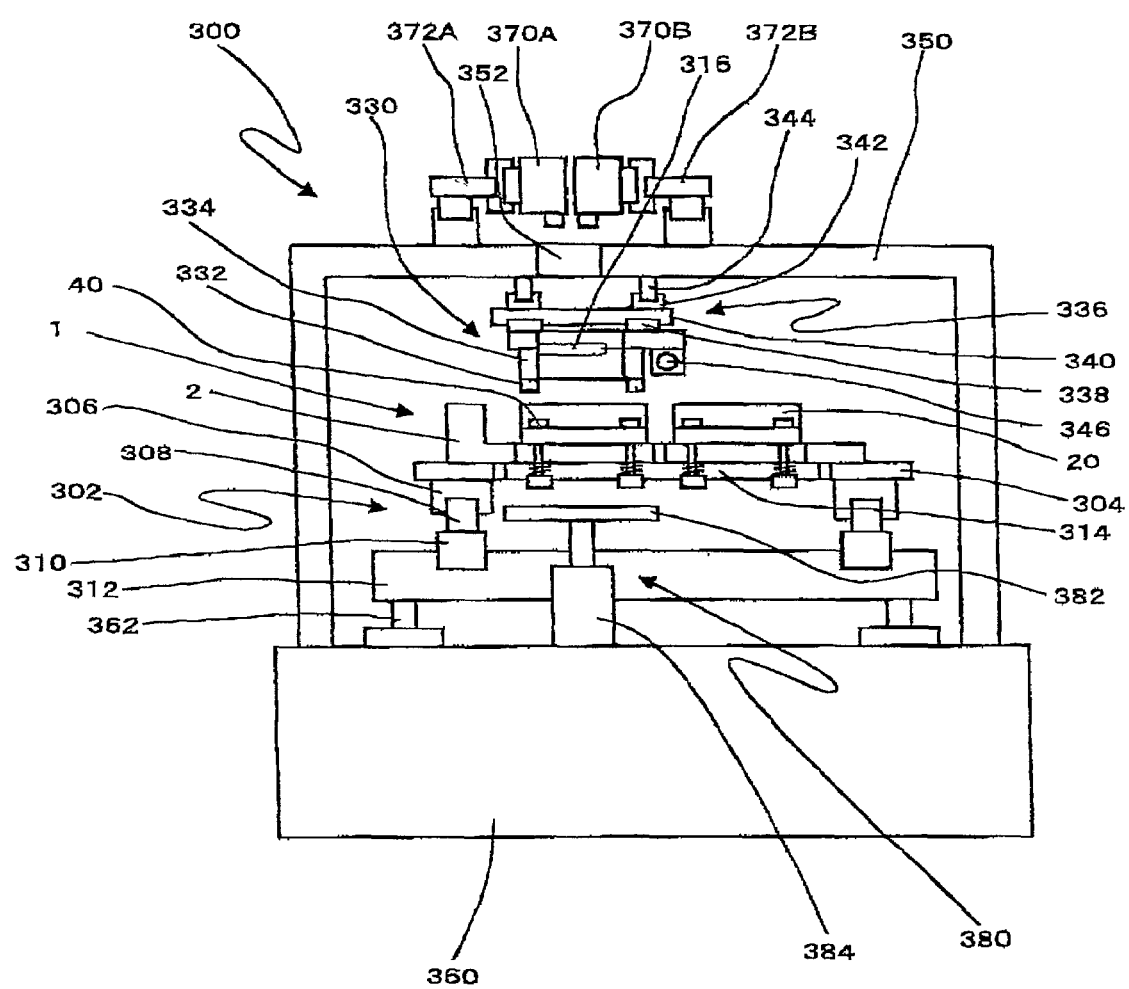
Figure 7:
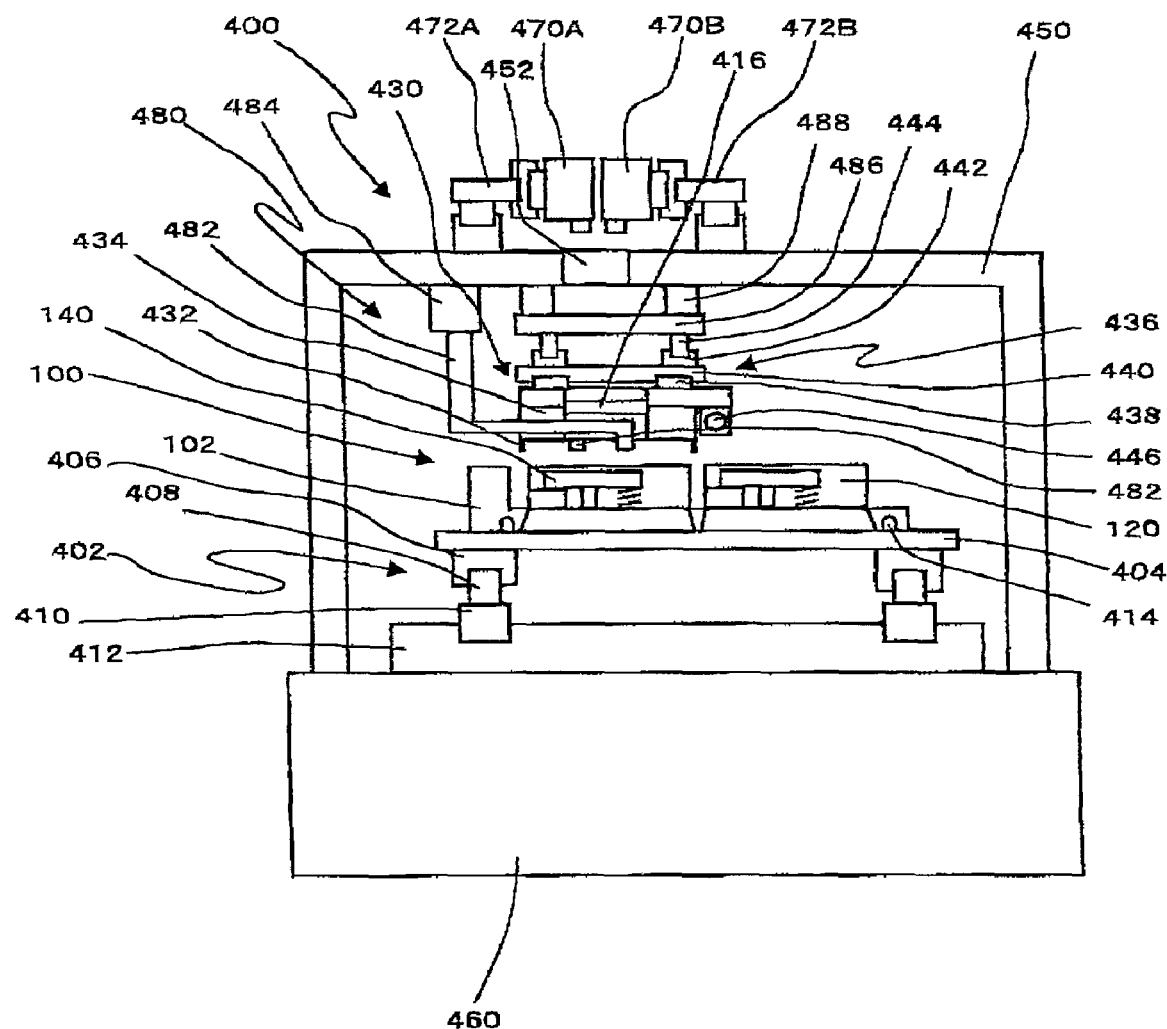
Figures 8A, 8B:
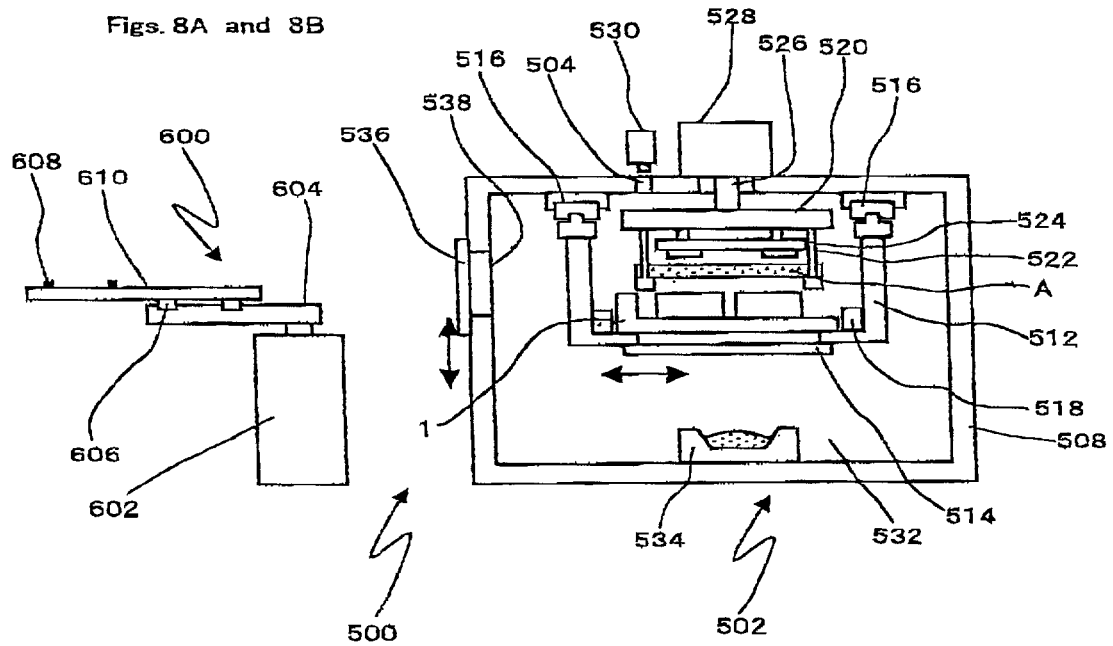
Figures 9A, 9B, 9C:
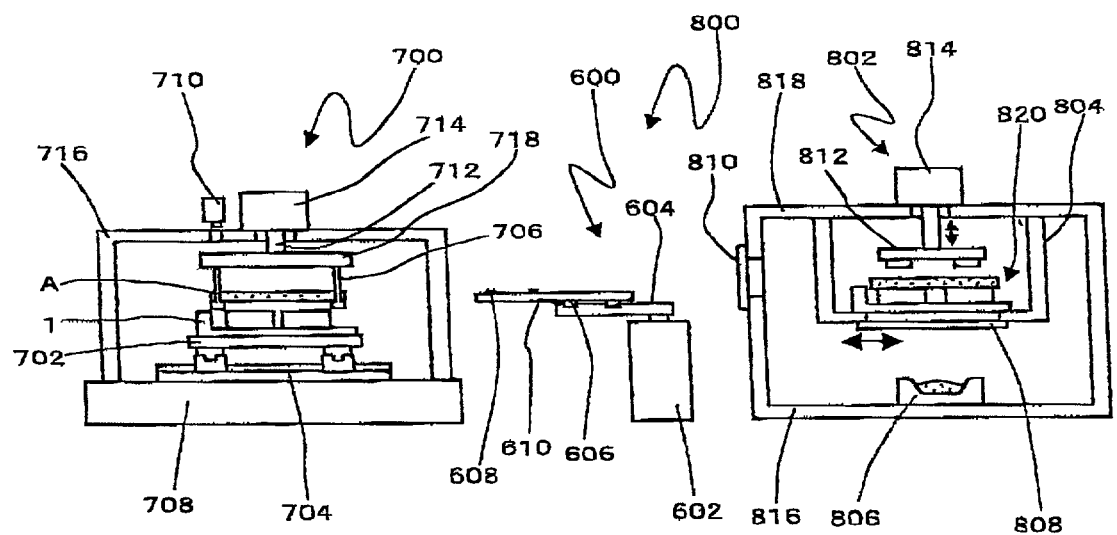
Figure 10:
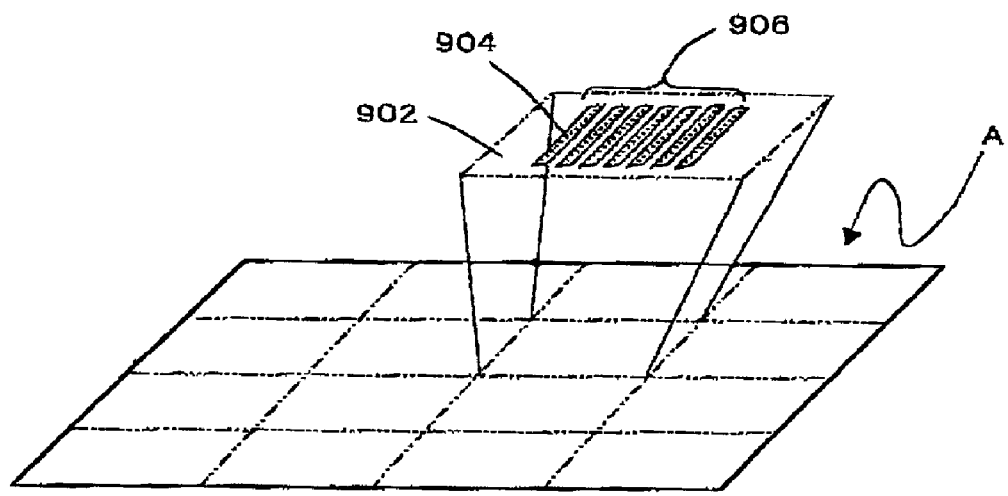
Figure 11:
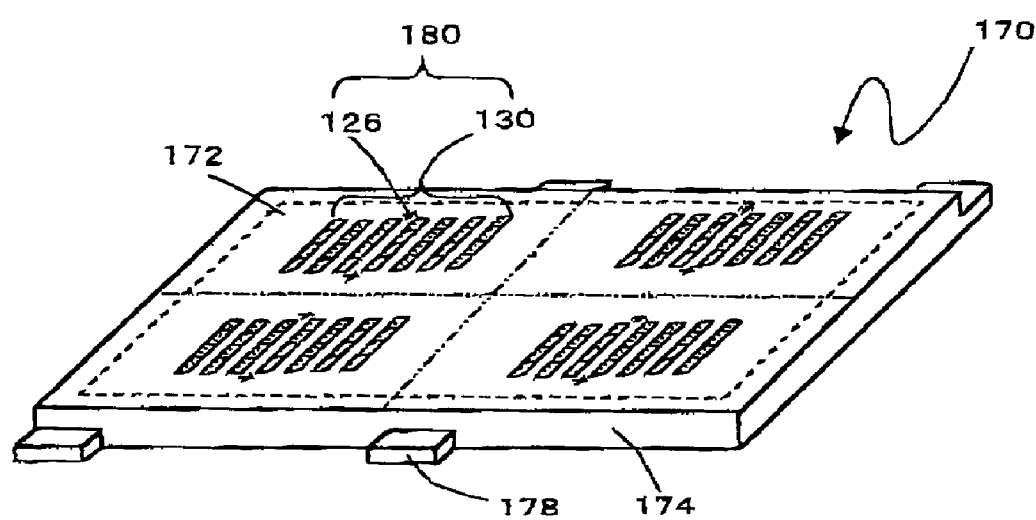

IG. 4 is an exploded perspective view of the integrated mask shown in FIG. 3;

FIG. 5 is a sectional view showing an embodiment of an integrated mask fabrication apparatus;

FIG. 6 is a sectional view showing another embodiment of an integrated mask fabrication apparatus;

FIG. 7 is a sectional view showing another embodiment of an integrated mask fabrication apparatus;

FIGS. 8A and 8B are sectional views showing an embodiment of a deposition apparatus using an integrated mask;

FIGS. 9A to 9C are sectional views showing another embodiment of a deposition apparatus using an integrated mask;

FIG. 10 is a perspective view showing an example of a pattern of ITO transparent electrodes; and FIG. 11 is a diagram perspective view showing an example of a deposition mask.

DETAILED DESCRIPTION

Preferred embodiments will be described below with reference to the accompanying drawings.

Figure 1:
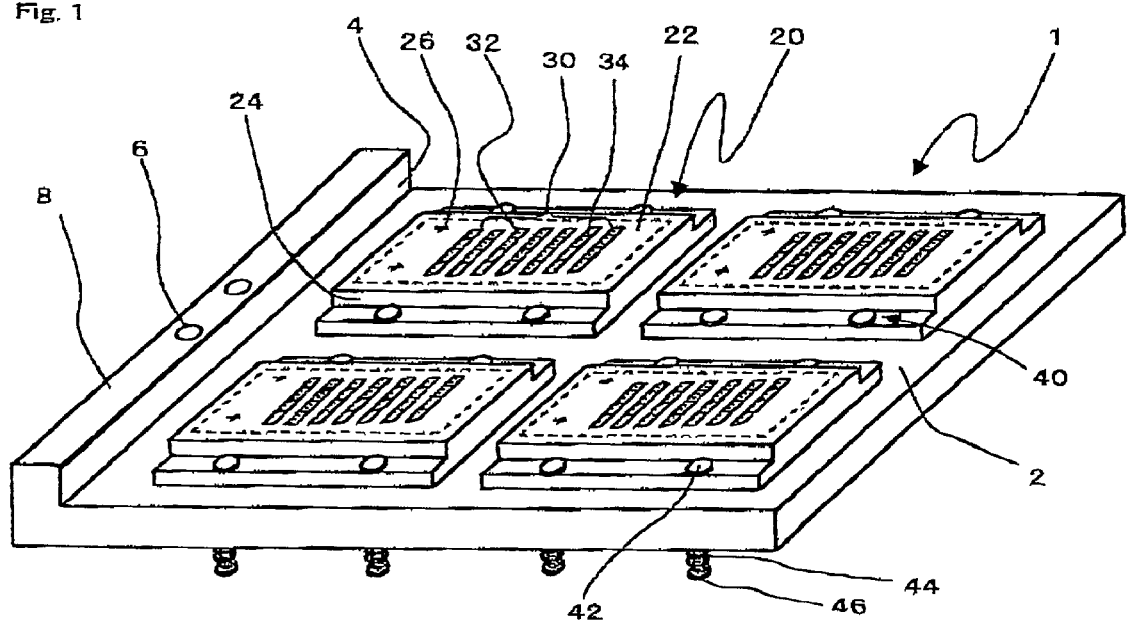
FIG. 1 is a perspective view showing an overall construction of an embodiment of an integrated mask.
Figure 2:
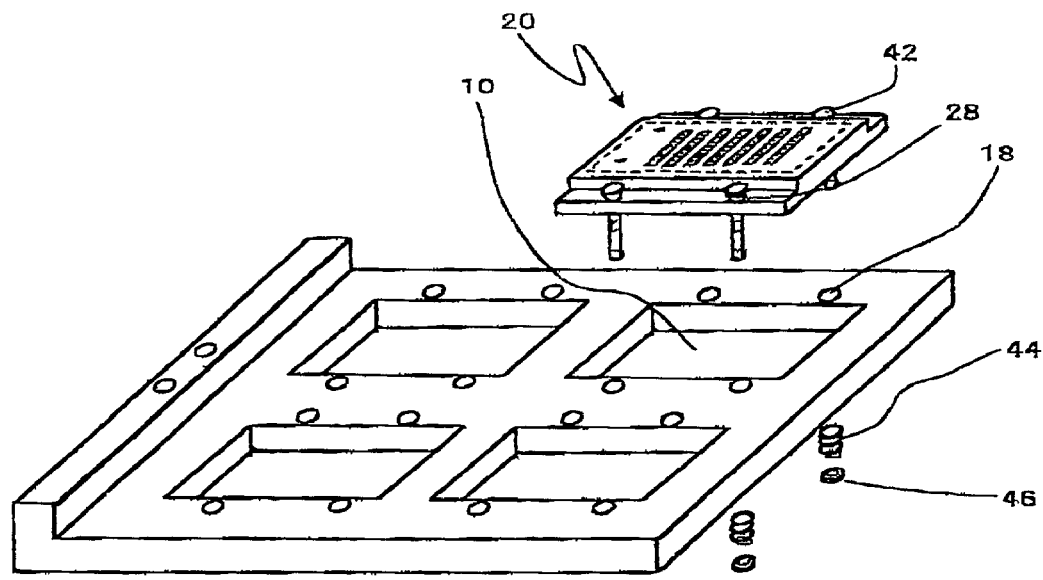
FIG. 2 is an exploded perspective view of the integrated mask shown in FIG. 1.
Figure 4:
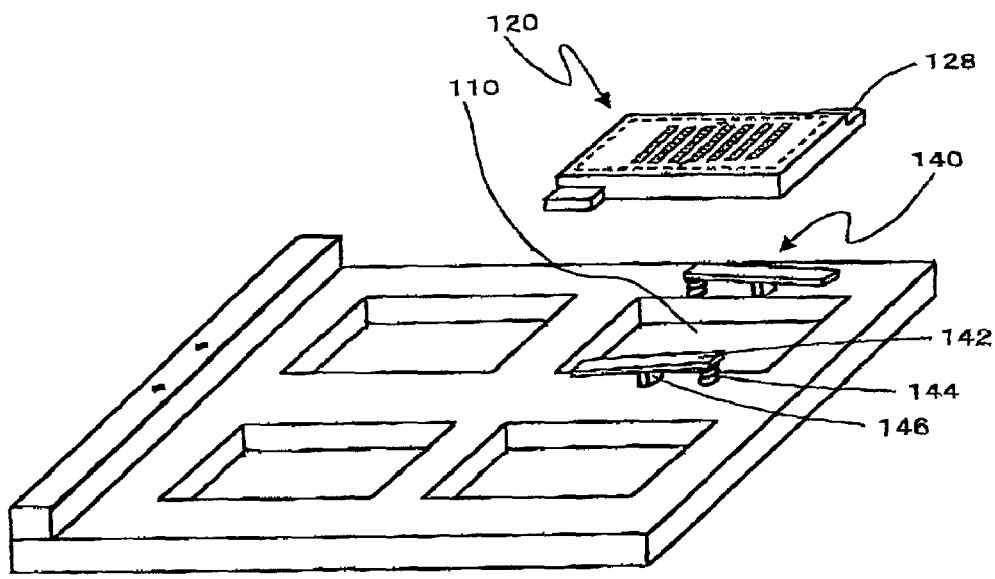

FIG. 1 is a perspective view showing an overall construction of an embodiment of an integrated mask, and FIG. 2 is an exploded perspective view of construction of another embodiment of an integrated mask according to the present invention, and FIG. 4 is an exploded perspective view of the integrated mask shown in FIG. 3.

With reference to FIGS. 1 and 2, an integrated mask 1 is constructed by retaining four deposition masks 20 on a base plate 2 with engaging units 40.

Each of the deposition masks 20 is set up by retaining a mask plate 22 provided with a aperture array 30 on a frame 24, the aperture array 30 having a plurality of deposition apertures 32 arranged in accordance with a deposition pattern. The frame 24 has an opening, the shape of which is shown by the dashed line, so that the space directly below the aperture array 30 is vacant. In addition, as shown in FIG. 2, the base plate 2 is provided with openings 10 at positions where the deposition masks 20 are placed, and the area of each of the openings 10 is larger than the area of the aperture array 30. The deposition apertures 32 are formed in the shape of, for example, rectangles, circles, etc., in accordance with the deposition pattern. The area of the openings 10 is preferably larger than the area of the aperture array 30 by 5% to 50%, and more preferably, by 20% to 100%.

Each of the deposition masks 20 is positioned on the base plate 2 such that the deposition apertures 32 are at predetermined positions by using alignment marks 6 formed on the top surface 8 of a projecting member 4 as the reference. The positions of the deposition apertures 32 may be directly detected and the deposition masks 20 may be positioned relative to the alignment marks 6 on the basis of the detection result. Alternatively, the mask plates 22 of the deposition masks 20 may be provided with alignment marks 26, and the positions of the alignment marks 26 relative to the alignment marks 6 may be adjusted. Preferably, the top surface 8 of the projecting member 4 on which the alignment marks 6 are formed and the top surface of the mask plate 22 of the deposition masks 20 are at the same height relative to the base plate 2. In such a case, the top surface 8 of the projecting member 4 and the top surface of the mask plate 22 have the same focal position, so that position detection can be easily performed using a camera.

As shown in FIGS. 1 and 2, each of the engaging units 40 includes a restraining pin 42, a compression spring 44, and a catch 46. The restraining pins 42 are inserted through holes 28 formed in the deposition masks 20 and holes 18 formed in the base plate 2. The compression springs 44 are attached to the restraining pins at the lower side of the base plate 2, and the catches 46 are fixed at the end of the restraining pins 42 so that the restraining pins 42 cannot be pulled out. Thus, the deposition masks 20 are pressed against the base plate 2 by a predetermined force applied by the compression springs 44, and are retained such that the deposition masks 20 cannot move due to the friction. If the catches 46 are pressed upward, the compression springs 44 are compressed, and gaps are generated between the heads of the restraining pins 42 and the deposition masks 20. Accordingly, the pressing force applied to the deposition masks 20 against the base plate 2 is removed, and the deposition masks 20 are able to move over the base plate 2. The deposition masks 20 are positioned relative to the base plate 2 while the retaining force is removed, and then the upward pressing force applied to the catches 46 is removed. Accordingly, the deposition masks 20 are retained by being pressed against the base plate 2 by the spring force of the engaging units 40. As described above, the engaging units 40 are able to fix the deposition masks 20 in a disengageable manner.

FIGS. 3 and 4 show another embodiment of an integrated mask, in which engaging units of a different type are used. With reference to FIGS. 3 and 4, an integrated mask 100 is set up by retaining four deposition masks 120 on a base plate 102 with engaging units 140. Each of the engaging units 140 includes a pressing plate 142, a compression spring 144, and a fulcrum 146. The pressing plates 142 are fixed on the top surface of the base plate 102 by the compression springs 144 and the fulcrums 146, and are pressed against tabs 128 provided on frames 124 of the deposition masks 120 by a force applied by the compression springs 144 via the fulcrums 146. Thus, the deposition masks 120 are pressed against the base plate 102 by a predetermined force, and are retained such that the deposition masks 120 cannot move due to the friction. If the pressing plates 142 are pressed downward at parts connected to the compression springs 144, the compression spring 144 is compressed and gaps are generated between the pressing plates 142 and the tabs 128. Accordingly, the pressing force applied to the deposition masks 120 against the base plate 102 is removed, and the deposition masks 120 are able to move over the base plate 102. The deposition masks 120 are positioned relative to the base plate 102 while the retaining force is removed, and then the downward pressing force applied to the pressing plates 142 is removed. Accordingly, the deposition masks 120 are retained by being pressed against the base plate 102 by the spring force of the engaging units 140. As described above, also in the present embodiment, the engaging units 140 are able to fix the deposition masks 120 in a disengageable manner.

The integrated mask is preferably designed such that a main direction of a force applied when the deposition masks are retained on the base plate by the engaging units is at an angle of not more than ±30° to the base plate. When the main direction of the force applied for retaining the deposition masks is at an angle of more than ±30°, there is a risk that the deposition masks will be retained at positions displaced from the predetermined positions relative to the base plate. In order to prevent this, the rigidity of the restraining pins, pressing plates, and fulcrums may be increased or the play of the fulcrum may be reduced.

When the above-described integrated mask is used for manufacturing organic EL devices, the temperature at the periphery of the integrated mask is increased because of the heat radiated from an evaporation source. Accordingly, the size of the integrated mask changes, and, as a result, the precision of the pattern of the thin film layer is changed. This change is preferably made as small as possible. Therefore, the base plate, the frames, etc. constructing the integrated mask are preferably formed of a material having a coefficient of thermal expansion of not more than $10^{-5}$, more preferably not more than $7 \times 10^{-6}$ and the most preferably not more than $4 \times 10^{-6}$. For example, Invar alloy, molybdenum, titanium, Kovar alloy, glass, ceramic, etc., may be used. In addition, from the same reason, the projecting member, on which the alignment marks are formed, is also preferably formed of a material having a coefficient of thermal expansion of not more than $10^{-5}$, more preferably not more than $7 \times 10^{-6}$ and the most preferably not more than $4 \times 10^{-6}$. The projecting member may be formed integrally with the base plate, or be formed separately from the base plate and attached to the base plate. When the projecting member is formed separately from the base plate, the projecting member and the base plate may be formed of different materials.

In the case in which the apertures formed in the mask plate have a thin, long shape and are arranged in a striped pattern, there is a problem in that the apertures are easily deformed due to the distortion, etc. In order to solve such a problem, reinforcing lines are formed across the thin, long apertures, so that the strength of the mask plate is increased and deformation of the apertures can be prevented. The thickness of the mask plate is preferably three times the width of the lines between the apertures or less, and more preferably, two times the width of the lines between the apertures or less. To be more specific, the thickness of the mask plates is preferably 500 µm or less, more preferably, 100 µm or less, and more preferably, 50 µm or less.

The mask plate can be manufactured by electroforming, etching, mechanical polishing, sand blasting, sintering, laser processing, etc. A mask plate having a precise mask pattern as used in the present invention is preferably manufactured by electroforming. When a mask plate manufactured by the above-described methods is fixed to a frame while tension is applied thereto, a deposition mask having a flat surface can be obtained. Although the method for fixing the mask plate to the frame is not limited, it is convenient to use an adhesive.

The mask plate may be formed of a metal such as stainless steel, copper alloy, Ni alloy, Fe—Ni alloy, aluminum alloy, or of various resin materials. However, the material for forming the mask plate is not limited to the materials mentioned above. In a case in which the mask pattern is precise and the mask plate does not have a sufficient strength, the attraction force between the mask plate and a substrate of organic EL devices must be increased by a magnetic force. In such a case, the mask plate is preferably formed of a known magnetic material.

When the deposition masks are arranged on the integrated mask, the size of the gaps between the deposition masks is preferably reduced. As the size of the gaps and other regions which are not utilized in the deposition process are reduced, the size of a substrate used for forming a predetermined number of organic EL devices can be reduced. Accordingly, cost of the substrate can be reduced. In addition, the size of a deposition apparatus can be reduced, and the thickness of the thin film layer can be made more uniform. The size of the gaps between the deposition masks is preferably 10 mm or less, more preferably, 5 mm or less, and even more preferably, 3 mm or less. In addition, since a deposition material travels toward the substrate at an angle in the deposition process, there are regions at which the material cannot be deposited on the substrate. These regions are also preferably made as small as possible. For this reason, the openings of the frame and apertures of the mask plate are formed such that the sectional views thereof are tapered.

FIG. 5 is a sectional view showing an embodiment of an integrated mask fabrication apparatus. In addition, FIG. 6 is a sectional view showing another embodiment of the integrated mask fabrication apparatus, and FIG. 7 is a sectional view showing still another embodiment of the integrated mask fabrication apparatus.

FIG. 5 shows an integrated mask fabrication apparatus 201 for fabricating the integrated mask 1 shown in FIG. 1. The integrated mask 1 is placed on a supporting plate 230 of an X-Y table 220, which is disposed on a base 240. The X-Y table 220 is able to move the supporting plate 230 in the X direction (horizontal direction in the figure) by guides 224 and rails 222, and in the Y direction (direction perpendicular to the page) by guides 226 and rails 228. Thus, the integrated mask 1 placed on the supporting plate 230 can be freely moved in the horizontal plane. The supporting plate 230 supports the integrated mask 1 at the peripheral regions of the base plate 2, and an opening 204 is formed at the central part of the supporting plate 230. In addition, the supporting plate 230 is provided with a plurality of suction holes at parts for supporting the base plate 2, so that the base plate 2 can be retained by air suction. Alternatively, the base plate 2 may also be retained by using pins. The opening 204 is formed at the region directly under the integrated mask 1, and a disengaging unit 232 including a pushing plate 234 and an air cylinder 236 is disposed below the opening 204. When the air cylinder 236 of the disengaging unit 232 is driven and the pushing plate 234 is moved upward, the catches 46 of the engaging units 40 are pushed upward and the restraining pins 42 come away from the deposition mask 20 of the integrated mask 1. Accordingly, the pressing force applied to the deposition mask 20 is removed and the deposition mask 20 can be freely moved over the base plate 2.

In addition, a retaining unit 250 is supported by a frame 242 extending from the base 240 at a position directly above the integrated mask 1, which is placed on the supporting plate 230. The retaining unit 250 includes a chucking pad 252 which retains the deposition masks 20 by air suction, a turntable 254 which rotates the chucking pad 252, a supporting plate 256 which supports the turntable 254, and an elevation unit 260 which moves the supporting plate 256 in the vertical direction. The elevation unit 260 is connected to the frame 242 at a predetermined position. The elevation unit 260 is moved by a driver (not shown), and it freely moves the turntable 254 and the chucking pad 252 in the vertical direction. The turntable 254 is provided with a circular hole 262 at the central region thereof, and is rotated in a horizontal plane by a motor 258. The frame 242 is also provided with a hole 264 at the position directly above the hole 262, and the alignment marks 6 of the deposition masks 20, etc., are observed through the holes 262 and 264 by a camera 266 attached to the frame 242 via a bracket 268.

The operation of fabricating the integrated mask 1 by the integrated mask fabrication apparatus 201 will be described below.

First, the deposition masks 20 are disposed on the base plate 2 of the integrated mask 1 at the predetermined positions. Then, the engaging units 40 are attached, and the positions of the deposition masks 20 are roughly adjusted. Then, after the above-described preparation, the integrated mask 1 is placed on the supporting plate 230 of the X-Y table 220 in the integrated mask fabrication apparatus 201, and the base plate 2 of the integrated mask 1 is held by air suction using a vacuum pump (not shown). The base plate 2 may also be retained using bolts, etc., instead of air suction. Next, the X-Y table 220 is moved such that one of the alignment marks 6 formed on the base plate 2 comes directly under the camera 266. By individually observing two alignment marks 6 by the camera 266, two-dimensional coordinates thereof can be determined and the origin of the coordinate system can be obtained. Then, when the position where one of the alignment marks 26 of the deposition mask 20 is supposed to be is denoted as position C, the X-Y table 220 is moved such that the position C comes directly under the camera 266. Accordingly, the alignment marks 26 are individually observed by the camera 266. When the alignment marks 26 of the deposition mask 20 are displaced from the desired positions, that is, when the alignment marks 26 are not observed at the central point of the camera 266 (intersection of a cross shown in a camera window), the position of the deposition mask 20 is adjusted by the following processes. First, the elevation unit 260 is driven and the chucking pad 252 is moved downward until they come into contact with the deposition mask 20, and the deposition mask 20 is chucked by the chucking pad 252. Then, the air cylinder 236 of the disengaging unit 232 is moved upward so that the pushing plate 234 pushes the catches 46 of the engaging units 40 upward against the spring force of the compression spring 44. Accordingly, the deposition mask 20 becomes free from the base plate 2. Then, the turntable 254 and the X-Y table 220 are moved and the relative position between the deposition mask 20 and the base plate 2 is changed such that the displacements of the alignment marks 26 are corrected. Then, after the position of the deposition masks 20 has been changed, the air cylinder 236 of the disengaging unit 232 is moved downward so that the pushing plate 234 comes away from the catches 46. Accordingly, the deposition mask 20 is retained on the base plate 2 by the spring force of the compression spring 44. Then, the chucking pad 252 releases the deposition mask 20, and the elevation unit 260 is moved upward. When the chucking pad 252 is completely separated from the deposition mask 20, the X-Y table 220 is moved such that the position C, that is, the position where one of the alignment marks 26 of the deposition mask 20 is supposed to be, comes directly under the camera 266. Accordingly, the positions of the alignment marks 26 are observed again by the camera 266, and the above-described processes for adjusting the position of the deposition mask 20 are repeated until the displacements of the alignment marks 26 are reduced to the allowable range.

When the positioning of one of the deposition mask 20 is completed, the X-Y table 220 is moved such that the position where the one of the alignment marks 26 of the next deposition mask 20 is supposed to be comes directly under the camera 266. Then, the above-described processes, that is, the process of observing the alignment marks 26 and the process of adjusting the position of the deposition mask 20 are repeated in a similar manner.

Next, with reference to FIG. 6, another embodiment of an integrated mask fabrication apparatus will be described below.

With reference to FIG. 6, in an integrated mask fabrication apparatus 300, the integrated mask 1 is placed and retained on a supporting plate 304 of an X-Y table 302, which is disposed on a base 360. The X-Y table 302 is able to move the supporting plate 304 in the X direction (horizontal direction in the figure) by guides 310 and rails 312, and in the Y direction (direction perpendicular to the page) by guides 306 and rails 308. Thus, the integrated mask 1 placed on the supporting plate 304 can be freely moved in the horizontal plane. In addition, the rails 312 are fixed to the base 360 via an elevation unit 362, so that the supporting plate 304 can also be freely moved in the vertical direction. The supporting plate 304 supports the integrated mask 1 at the peripheral part of the base plate 2, and an opening 314 is formed at the central part of the supporting plate 304. In addition, the supporting plate 304 is provided with a plurality of suction holes at parts for supporting the base plate 2, so that the base plate 2 can be retained on the supporting plate 304 by air suction. The opening 314 is formed at the region directly under the integrated mask 1, and a disengaging unit 380 including a pushing plate 382 and an air cylinder 384 is disposed on the base 306 at the region below the opening 314. When the air cylinder 384 of the disengaging unit 380 is driven and the pushing plate 382 is moved upward, the catches 46 of the engaging units 40 are pushed upward and the restraining pins 42 come away from the deposition mask 20 of the integrated mask 1. Accordingly, the pressing force applied to the deposition mask 20 is removed and the deposition mask 20 can be freely moved over the base plate 2.

In addition, a retaining unit 330 used for retaining and moving the deposition masks 20 of the integrated mask 1 is disposed at a position directly above the integrated mask 1. The retaining unit 330 includes a chucking pad 332 which retain the deposition masks 20 by air suction, a turntable 334 which rotates the chucking pad 332 in a horizontal plane, and an upper X-Y table 336 which moves the chucking pad 332 in the X and Y directions. The turntable 334 is fixed to the upper X-Y table 336, and the upper X-Y table 336 is fixed to a frame 350 via rails 344. The upper X-Y table 336 is moved in the X direction by guides 338 attached to the turntable 334 and rails 340, and in the Y direction by guides 342 attached to the rails 340 and the rails 344.

The turntable 334 is provided with a circular hole 316 at the central region thereof, and is rotated in a horizontal plane by a motor 346. The frame 350 is also provided with a hole 352 at the position directly above the hole 316, and the alignment marks 6 of the deposition masks 20, etc., are observed through the holes 316 and 352 by two cameras 370A and 370B attached to the frame 350 via adjusters 372A and 372B. The adjusters 372A and 372B are able to perform fine adjustments of the vertical and horizontal positions of the cameras 370A and 370B.

The operation of fabricating the integrated mask 1 by the integrated mask fabrication apparatus 300 will be described below.

First, the deposition masks 20 are disposed on the base plate 2 of the integrated mask 1 at the predetermined positions. Then, the engaging units 40 are attached, and the positions of the deposition masks 20 are roughly adjusted. Then, after the above-described preparation, the integrated mask 1 is placed on the supporting plate 304 of the X-Y table 302 in the integrated mask fabrication apparatus 300, and the base plate 2 of the integrated mask 1 is retained by air suction. Next, the X-Y table 302 is moved such that the alignment marks 6 formed on the base plate 2 come directly under the two cameras 370A and 370B. Thus, a reference position D is determined. Then, fine adjustments of the positions of the cameras 370A and 370B are performed using the adjusters 372A and 372B, respectively, so that the two alignment marks 6 come to the central points of the two cameras 370A and 370B, that is, at the intersections of crosses shown in camera windows.

After the adjustment of the positions of the two cameras 370A and 370B, the X-Y table 302 is driven and the integrated mask 1 is moved, using the position D as the reference, such that the positions where the alignment marks 26 of one of the deposition masks 20 are supposed to be come directly under the cameras 370A and 370B. Then, the alignment marks 26 of the deposition mask 20 are observed by the two cameras 370A and 370B. When the alignment marks 26 are displaced from the central points of the two cameras 370A and 370B (intersections of crosses shown in camera windows), the following processes are performed. First, the elevation unit 362 is driven and the X-Y table 302 is moved upward until the chucking pad 332 of the retaining unit 330 comes into contact with the deposition mask 20, and the deposition mask 20 is retained by the chucking pad 332 by using a vacuum pump. Then, the air cylinder 384 of the disengaging unit 380 is moved upward so that the pushing plate 382 pushes the catches 46 of the engaging units 40 upward against the spring force of the compression spring 44. Accordingly, the deposition mask 20 becomes free from the base plate 2. Then, the turntable 334 and the upper X-Y table 336 are driven and the deposition mask 20 is moved over the base plate 2 in a horizontal plate such that the alignment marks 26 come to the central points of the two cameras 370A and 370B (intersections of crosses shown in camera windows). When the alignment marks 26 are observed at the predetermined positions by the cameras 370A and 370B, the air cylinder 384 of the disengaging unit 380 is moved downward so that the pushing plate 382 comes away from the catches 46. Accordingly, the deposition mask 20 is retained on the base plate 2. Then, the air suction by the chucking pad 332 is canceled, and the elevation unit 362 is driven and the X-Y table 302 is moved downward so that the chucking pad 332 comes away from the deposition mask 20. Then, the above-described processes for adjusting the position are performed for the next deposition mask 20.

Next, with reference to FIG. 7, still another embodiment of an integrated mask fabrication apparatus will be described below.

FIG. 7 shows an integrated mask fabrication apparatus 400 for fabricating the integrated mask 100 shown in FIG. 3. In the integrated mask fabrication apparatus 400, the integrated mask 100 is placed and retained on a supporting plate 404 of an X-Y table 402, which is disposed on a base 460. The X-Y table 402 is able to move the supporting plate 404 in the X direction (horizontal direction in the figure) by guides 410 and rails 412, and in the Y direction (direction perpendicular to the page) by guides 406 and rails 408. Thus, the integrated mask 100 placed on the supporting plate 404 can be freely moved in the horizontal plane. The rails 412 are fixed to the base 460. The base plate 102 is retained on the supporting plate 404 by pins 414. A disengaging unit 480 including a pushing plate 482 and an air cylinder 484 is fixed to a frame 450. When the air cylinder 484 of the disengaging unit 480 is driven and the pushing plate 482 is moved downward, the pressing plate 142 of the engaging unit 140 is pushed downward at a part connected to the compression spring 144. Thus, the compression spring 144 is compressed and a gap is generated between the pressing plate 142 and the tab 128, so that the deposition mask 120 is released and can be freely moved over the base plate 2.

In addition, a retaining unit 430 used for retaining and moving the deposition masks 120 of the integrated mask 100 is disposed at a position directly above the integrated mask 100. The retaining unit 430 includes clamping pins 432 which clamp the deposition masks 120, a turntable 434 which rotates the clamping pins 432 in a horizontal plane, and an upper X-Y table 436 which moves the clamping pins 432 in the X and Y directions. The turntable 434 is fixed to the upper X-Y table 436, and the upper X-Y table 436 is fixed to a retaining unit supporter 486 via rails 444. The upper X-Y table 436 is moved in the X direction by guides 438 attached to the turntable 434 and rails 440, and in the Y direction by guides 442 attached the rails 440 and the rails 444. The retaining unit 430 is fixed to the frame 450 via the retaining unit supporter 486 and an air cylinder 488.

The turntable 434 is provided with a circular hole 416 at the central region thereof, and is rotated in a horizontal plane by a motor 446. The frame 450 is also provided with a hole 452 at the position directly above the hole 416, and the alignment marks 6 of the deposition masks 20, etc., are observed through the holes 416 and 452 by two cameras 470A and 470B attached to the frame 450 via adjusters 472A and 472B. The adjusters 472A and 472B are able to perform fine adjustments of the vertical and horizontal positions of the cameras 470A and 470B.

The operation of fabricating the integrated mask 100 by the integrated mask fabrication apparatus 400 will be described below.

First, the deposition masks 120 are disposed on the base plate 102 of the integrated mask 100 at the predetermined positions. Then, the engaging units 140 are attached, and the positions of the deposition masks 120 are roughly adjusted. Then, after the above-described preparation, the integrated mask 100 is fixed on the supporting plate 404 of the X-Y table 402 in the integrated mask fabrication apparatus 400. The integrated mask 100 may be fixed by inserting the pins 414 of the supporting plate 404 into holes formed in the base plate 102 and pressing the base plate 102 against the supporting plate 404 by suitable means. Next, the X-Y table 402 is moved such that the alignment marks 106 formed on the base plate 102 come directly under the two cameras 470A and 470B. Thus, a reference position E is determined. Then, fine adjustments of the positions of the cameras 470A and 470B are performed using the adjusters 472A and 472B, respectively, so that the two alignment marks 106 come to the central point of the two cameras 470A and 470B, that is, at the intersections of crosses shown in camera windows.

After the adjustment of the positions of the two cameras 470A and 470B, the X-Y table 402 is driven and the integrated mask 100 is moved, using the position E as the reference, such that the positions where the alignment marks 126 of one of the deposition masks 120 are supposed to be come directly under the cameras 470A and 470B. Then, the alignment marks 126 of the deposition mask 120 are observed by the two cameras 470A and 470B. Then, the alignment marks 126 of the deposition mask 120 are observed by the two cameras 470A and 470B. When the alignment marks 126 are displaced from the central point of each of the two cameras 470A and 470B (intersection of a cross shown in a camera window), the following processes are performed. First, the retaining unit 430 is moved downward and the deposition mask 120 is clamped and retained by the clamping pins 432. Then, the disengaging unit 480 is driven and the pushing plate 482 is moved downward so that the pushing plate 482 pushes the pressing plate 142 of the engaging unit 140 downward against the spring force of the compression spring 144. Accordingly, the deposition mask 120 becomes free from the base plate 102. Then, the turntable 434 and the upper X-Y table 436 are driven and the deposition mask 120 is moved over the base plate 102 such that the alignment marks 126 come to the central points of the two cameras 470A and 470B (intersections of crosses shown in camera windows). When the alignment marks 126 are observed at the predetermined positions by the cameras 470A and 470B, the air cylinder 484 of the disengaging unit 480 is moved upward so that the pushing plate 482 comes away from the pressing plate 142. Accordingly, the deposition mask 120 is retained on the base plate 102. Then, the deposition mask 120 is released from the clamping pins 432, and the retaining unit 430 is moved upward so that the clamping pins 432 are separated from the deposition mask 120. Then, the above-described processes for adjusting the position are performed for the next deposition mask 120.

In the above-described processes for positioning the deposition mask, the allowable displacement of the alignment marks, that is, the displacement range in which the positioning of the deposition mask is regarded as completed, is preferably set to 100 µm or less, more preferably, 20 µm or less, and even more preferably, 5 µm or less. In addition, the suction force at which the chucking pad chucks the deposition mask and the suction force applied for retaining the base plate on the supporting plate are preferably in the range of 0.1 to 50 kPa, and more preferably, 5 to 20 kPa. Means for moving and positioning the deposition mask relative to the base plate is not limited to the above-described chucking pad or the clamping mechanism. Alternatively, a frictional force generated when a certain member is pressed against the deposition mask may be utilized, or a clamping mechanism utilizing air suction may be applied.

FIGS. 8A and 8B are sectional views showing an embodiment of a deposition apparatus using the integrated mask, and FIGS. 9A to 9C are sectional views showing another embodiment of a deposition apparatus using the integrated mask.

With reference to FIGS. 8A and 8B, a deposition system 500 for forming an emitting layer, etc., using the integrated mask 1 will be described below. The deposition system 500 includes a deposition apparatus 502 which uses the integrated mask 1. The integrated mask 1 is supported by a mask holder 512 disposed in a vacuum chamber 532 covered by an external wall 508, and the base plate 2 of the integrated mask 1 is fixed by fixing members 518 so that the base plate 2 cannot move relative to the mask holder 512. The vacuum chamber 532 is connected to a vacuum suction unit (not shown), and the degree of vacuum in the vacuum chamber 532 is adjusted to the value required for the deposition process. A glass substrate A is supported by a substrate holder 522 in the vacuum chamber 532 at the bottom surface thereof. In addition, the substrate holder 522 is connected to a motor 528 via a bracket 520 and an elevation shaft 526. The elevation shaft 526 includes guides and a driver, and is able to move the substrate holder 522 in the vertical direction. In addition, the motor 528 is able to rotate the elevation shaft 526 and the components attached thereto. Accordingly, the substrate A can be freely moved in the vertical direction and rotated in a horizontal plane by the elevation shaft 526 and the motor 528 inside the vacuum chamber 532.

The mask holder 512 is connected to an X-Y guide 516, which is fixed at the upper side of the external wall 508. The X-Y guide 516 can be freely moved in the X and Y directions by a driver (not shown), so that the integrated mask 1 on the mask holder 512 can be freely moved in a horizontal plane. The alignment marks 6 of the integrated mask 1 and alignment marks formed in the substrate A, the apertures formed in the deposition masks 20, etc., are observed by a camera 530 through a looking glass 504 formed in the external wall 508. In accordance with the observation result, the positional relationship between the integrated mask 1 and the substrate A is adjusted in the rotational direction by the X-Y guide 516 in the X and Y directions and by the motor 528. When the alignment marks of the substrate A are observed, the elevation shaft 526 is moved downward and the substrate A is placed on the integrated mask 1. Thus, the observation is performed while the substrate A is disposed on the integrated mask 1. Then, after the adjustment of the relative position between the substrate A and the integrated mask 1, a pressing member 524, which can be moved in the vertical direction relative to the bracket 520 by a driver (not shown), is moved downward.

Thus, the pressing member 524 presses the substrate A, and the adhesion force between the substrate A and the integrated mask 1 is increased. Alternatively, the adhesion force between the substrate A and the integrated mask 1 may also be increased by forming at least a part of the pressing member 524 of a magnetic material so that an attraction force is applied to the deposition masks 20, which is formed of a magnetic material.

In addition, an evaporation source 534 is disposed under the integrated mask 1 in the vacuum chamber 532. When a material is inserted in the evaporation source 534 and is heated to a predetermined temperature, the material evaporates. Then, only some of the material that passes through the deposition apertures 32 formed in the deposition masks 20 in the integrated mask 1 adheres to the substrate A, so that a layer having a predetermined pattern is formed on the substrate A. In order to freely start/shop the deposition on the substrate A, a moveable deposition shutter 514 is disposed at the upper side of the evaporation source 534. In addition, when the substrate A is transferred into and out of the vacuum chamber 532, a moveable shutter 536 is opened, and the substrate A is carried through an opening 538 formed in the external wall 508 by a transfer apparatus 600.

The transfer apparatus 600 includes a base plate 604 which can be rotated and moved vertically relative to a base 602 and a slide plate 610 which can be reciprocated above the base plate 604 by guides 606. The substrate A is placed on pads 608 disposed on the slide plate 610, and is transferred to any position within the moveable range.

The operation of the deposition system 500 will be described below with reference to FIGS. 8A and 8B.

First, the integrated mask 1 is placed on the mask holder 512 in the vacuum chamber 532, and is fixed. Then, the alignment marks 6 of the integrated mask 1 are observed by the camera 530, and the positions thereof are determined and memorized by an image processing unit (not shown).

Then, the shutter 536 is opened and the substrate A is placed on the substrate holder 522 by the transfer apparatus 600. After the slide plate 610 of the transfer apparatus 600 has moved out from the vacuum chamber 532, the shutter 536 is closed, and the vacuum pump (not shown) is driven such that the degree of vacuum in the vacuum chamber 532 is adjusted to a predetermined value. Then, the elevation shaft 526 is moved downward and the substrate A is placed on the integrated mask 1, and the alignment marks of the substrate A are observed by the camera 530 through the looking glass 504. Then, the elevation shaft 526 is moved upward until the substrate A comes away from the integrated mask 1, and the X-Y guide 516 and the motor 528 are moved such that the positions of the alignment marks of the integrated mask 1 and the positions of the alignment marks of the substrate A are made the same.

After the above-described positioning process, the alignment marks of the integrated mask 1 are observed by the camera 530. Then, the elevation shaft 526 is moved downward and the substrate A is placed on the integrated mask 1, and the alignment marks of the substrate A are observed by the camera 530. Since the alignment marks 6 of the integrated mask 1 and the alignment marks of the substrate A can be corrected by calculation, it is not necessary to place them at the same positions. When the alignment marks of the integrated mask 1 and the substrate A are at the same positions, subsequent processes of calculation, etc., can be omitted. When the alignment marks of the integrated mask 1 and the substrate A are not at the same positions, the elevation shaft 526 is moved upward until the substrate A comes away from the integrated mask 1, and the process of adjusting the relative position is performed similarly as described above. Then, the processes of observing and adjusting the positions of the alignment marks of the integrated mask 1 and the substrate A are repeated until the alignment marks 6 of the integrated mask 1 and the alignment marks of the substrate A are observed at the same positions. Then, the pressing member 524 is moved downward, and the pressing member 524 presses the substrate A against the integrated mask 1. The pressing force is preferably in the range of 10 to 100 N.

Then, the evaporation source 534 is heated so that an organic material evaporates, and the deposition shutter 514 is opened so that the organic material adheres to the substrate A in accordance with the mask pattern. When an organic layer having a predetermined thickness is formed, the deposition shutter 514 is closed and the deposition process is stopped. Then, the pressure in the vacuum chamber 532 is increased to atmospheric pressure. At the same time, the pressing member 524 is moved upward and the shutter 536 is opened, and the substrate A, on which the organic layer having the pattern corresponding to the mask pattern is formed, is carried out by the transfer apparatus 600 and is transferred to the place where the next process is performed.

Since a relatively long time is required for adjusting the degree of vacuum in the vacuum chamber 532 to the predetermined value, the transfer apparatus 600 may be disposed inside the vacuum chamber 532. In such a case, the process of repeatedly changing the pressure inside the vacuum chamber 532 between atmospheric pressure and vacuum can be omitted and the efficiency can be improved.

Next, another embodiment of a deposition apparatus using the integrated mask 1 will be described below with reference to FIGS. 9A to 9C. With reference to FIGS. 9A to 9C, a deposition system 800 includes a positioning apparatus 700, a transfer apparatus 600, and a deposition apparatus 802. The positioning apparatus 700 is used for positioning the substrate A on the integrated mask 1, and the transfer apparatus 600 is used for transferring a substrate-mask unit 820, in which the substrate A is disposed on the integrated mask 1 in such a manner that the alignment marks thereof are at the same position. In addition, the deposition apparatus 802 receives the substrate-mask unit 820 and performs a process of depositing an organic material.

The positioning apparatus 700 includes a mask holder 702 which supports the integrated mask 1; an X-Y table 704 which freely moves the mask holder 702 in a horizontal plane (in the X and Y directions); a substrate holder 706 which supports the substrate A; a rotation motor 714 to which the substrate holder 706 is connected via a bracket 718 and an elevation shaft 712; a frame 716 which supports the rotation motor 714; a base 708 which supports the frame 716 and the X-Y table 704; and a camera 710 which observes the alignment marks of the integrated mask 1 and the substrate A. The elevation shaft 712 includes guides and a driver, and is able to the substrate holder 706 in the vertical direction. In addition, the rotation motor 714 is able to freely rotate the substrate holder 706.

The transfer apparatus 600 has completely the same construction as the transfer apparatus used in the above-described deposition system 500. The deposition apparatus 802 includes a holder 804 which supports the substrate-mask unit 820 inside a vacuum chamber 816; a pressing member 812 which can be moved in the vertical direction and which presses the substrate A against the integrated mask 1 at a predetermined force; an evaporation source 806 of an organic material; and a moveable deposition shutter 808 which impedes the material evaporated at the evaporation source 806 from reaching the substrate A. The pressing member 812 is connected to a cylinder 814 fixed on an external wall 818 of the vacuum chamber 816, and is moved by the cylinder 814 in the vertical direction. A vacuum pump (not shown) is connected to the vacuum chamber 816, and the degree of vacuum in the vacuum chamber 816 can be set adjusted. The substrate-mask unit 820 is transferred into the vacuum chamber 816 through an opening which is normally covered by a moveable shutter 810.

The operation of the deposition system 800 will be described below with reference to FIGS. 9A to 9C.

First, the integrated mask 1 is placed on the mask holder 702 in the positioning apparatus 700, and the alignment marks 6 of the integrated mask 1 are observed by the camera 710. Then, the substrate A is placed on the substrate holder 706, and the substrate holder 706 is moved downward so that the substrate A is placed on the integrated mask 1. Then, the alignment marks of the substrate A are observed by the camera 710, and the substrate holder 706 is moved upward. Then, the X-Y table 704 and the rotation motor 714 are controlled such that the positions of the alignment marks 6 of the integrated mask 1 and the positions of alignment marks of the substrate A are made the same. Then, the alignment marks 6 of the integrated mask 1 and the substrate A are observed again, and the processes of positioning and observing the alignment marks are repeated until the alignment marks 6 of the integrated mask 1 and the alignment marks of the substrate A are observed at the same positions. Then, the substrate-mask unit 820, in which the substrate A is placed on the integrated mask 1, is carried from the substrate holder 706 to the pad 608 of the transfer apparatus 600. Then, the shutter 810 of the deposition apparatus 802 is opened and the substrate-mask unit 820 is placed on the holder 804, and the pressing member 812 is moved downward so that the substrate A is pressed against the integrated mask 1 at a predetermined force. The pressing force is preferably in the range of 10 to 300 N. After the slide plate 610 of the transfer apparatus 600 has moved out from the vacuum chamber 816, the shutter 810 is closed, and the vacuum pump (not shown) is driven such that the degree of vacuum in the vacuum chamber 816 is adjusted to a predetermined value. Then, the evaporation source 806 is heated so that an organic material evaporates, and the deposition shutter 808 is opened so that the organic material adheres to the substrate A in accordance with the mask pattern.

When the deposition is completed, the deposition shutter 808 is closed and the pressure in the vacuum chamber 816 is increased to atmospheric pressure. Then, the shutter 810 is opened and the substrate-mask unit 820, on which the organic layer is formed, is carried out by the transfer apparatus 600 and is transferred to the place where the next process is performed.

The positioning apparatus 700 and the transfer apparatus 600 may also be disposed inside the vacuum chamber 816. In such a case, the substrate A and the integrated mask 1 are positioned and transferred in a vacuum. Thus, the process of repeatedly changing the pressure inside the vacuum chamber 816 between atmospheric pressure and vacuum can be omitted, and the productivity can be significantly increased.

In the case in which n organic EL devices (n is an integer equal to or greater than 2) are formed on a single substrate by applying the present invention, an integrated mask in which n deposition masks are retained on a base plate is used. However, when n is large, it requires much time and labor to adjust the positions of all the n deposition masks, and regions which cannot be utilized in the depositions processes, for example, frames used for retaining the deposition masks, gaps between the deposition masks, etc., are increased. In such a case, m deposition masks (m is an integer in the range of 2 to n), wherein m satisfies n=m×k (k is an integer in the range of 2 to n), are preferably disposed in an integrated mask.

For example, in the case in which sixteen organic EL devices are formed in a single substrate (n=16), an integrated mask having four deposition masks (m=4) may be used. When each deposition mask has four aperture arrays corresponding to four organic EL devices (k=4), n=m×k is satisfied. In such a case, compared with the case in which sixteen deposition masks are disposed in a single integrated mask (n=16, m=16, k=1), the number of times the positioning process is performed is reduced to four. Thus, in order to efficiently manufacture the organic EL devices without degrading the accuracy thereof, it is important to make the size of the deposition masks as large as possible within the limit such that satisfactory dimensional accuracy can be obtained. With respect to the above-described case, the combination of n=16, m=2, and k=8, or the combination of n=16, m=8, and k=2, may also be applied in accordance with the balance between the dimensional accuracy and the efficiency. According to the present invention, the combination of n, m, and k may be freely determined.

The above-described relationship of n=m×k is especially effective in the case in which a large number of small-sized organic EL devices are formed on a relatively large substrate. The size of the luminescent area of the organic EL devices is preferably 80 mm×60 mm or smaller, and more preferably, 40 mm×30 mm or smaller. In addition, the number of organic EL devices to be formed on a single substrate is preferably 6 or more, more preferably, 16 or more, 32 or more, or 64 or more.

The apparatus and methods will now be described by way of Examples. It should be noted, however, that the apparatus and methods defined in the appended claims is not restricted to the Examples below.

EXAMPLES

Example 1

Example 1 will be described below with reference to FIGS. 1, 2 and 5. A plate formed of Ni alloy (84 mm wide, 105 mm long, and 25 μm thick) was prepared as the mask plate 22 for forming an emitting layer. In addition, 272 rectangular apertures (100 μm wide and 64 μm long) were arranged with 300 μm pitch as the deposition apertures 32. The rectangular apertures were arranged such that the longitudinal direction thereof (the direction in which the dimension was 64 mm) was along the width direction of the plate (the direction in which the dimension was 84 μm). In order to prevent the apertures from being deformed, 20 μm wide reinforcing lines were formed in parallel to the width direction of the apertures with 300 μm pitch. Two cross-shaped alignment marks 26 were formed on the plate on a line 5 mm away from the left end of the plate, at positions symmetrical in the width direction of the plate with a distance of 30 mm therebetween. Sixteen plates in total were similarly manufactured as the mask plates.

Each of the mask plates manufactured as described above was fixed to a frame 24 (104 mm wide and 105 mm long) formed of stainless steel at an attachment portion (84 mm wide and 105 mm long) thereof using epoxy resin. Accordingly, sixteen deposition masks 20 in total were manufactured. In the frame, the thickness of the attachment portion was 10 mm, and an opening (76 mm wide and 97 mm long) was formed at the central region thereof, leaving an allowance of 4 mm at the periphery thereof. In addition, the frame was 5 mm thick at parts within 10 mm from both sides in the width direction, and two fixing holes having the diameter of 5 mm were formed at each side. Thus, four fixing holes were formed in total.

An aluminum plate (441 mm wide, 457 mm long, and 5 mm thick) in which openings 10 (76 mm wide and 97 mm long) were formed was prepared as the base plate 2. The openings 10 were arranged in four lines in the width direction, starting at a position 19 mm from the top with 109 mm pitch, and in four lines in the longitudinal direction, starting at a position 20 mm from the left end with 110 mm pitch. Accordingly, sixteen (4×4, 4 ranks and 4 files) openings in total were formed in the base plate. Then, the above-described sixteen deposition masks were disposed on the base plate in such a manner that the openings in the deposition masks were aligned with the openings in the base plate. Then, the deposition masks were retained to the base plate using four engaging units 40 for each deposition mask. Accordingly, an integrated mask in which the positions of the deposition masks were roughly adjusted was manufactured. The thickness of a part of the integrated mask within 10 mm from the left end in the longitudinal direction thereof was 15 mm. In this part of the integrated mask, two holes (1 mm in diameter, 5 mm deep) were formed as the alignment marks 6 on a line 5 mm away from the left end at positions symmetrical in the width direction with a distance of 30 mm therebetween. The surface on which the alignment marks were formed and the top surface of the deposition masks were at the same height relative to the base plate. The engaging units 40 were formed of stainless steel. The diameter of the head of the restraining pin 42 was 8 mm, and the diameter of the shaft portion of the restraining pin 42 which was inserted through the hole formed in the base plate was 4 mm. In addition, spring constant of the compression spring 44 was 10 N/mm, and each of the deposition masks was pressed against the base plate at 100 N.

Next, the integrated mask 1 was placed on the supporting plate 230 of the integrated mask fabrication apparatus 201, and the positions of the sixteen deposition masks placed on the base plate were adjusted until the displacements of the alignment marks were reduced to 5 μm or less. In the integrated mask fabrication apparatus 201, the X-Y table 220 was able to move in the horizontal plane in steps of 1 μm, and the turntable 254 was able to rotate in steps of 0.001 degrees. The chucking pad 252 had the same outside shape as the deposition masks, and the surface of the chucking pad 252 was coated with Teflon. In addition, a plurality of holes were formed in the surface of the chucking pad 252, and the chucking pad 252 was able to apply a suction force of 1 to 50 kPa. The size of the supporting plate 230 was 500 mm×500 mm, and the opening 204 (400 mm wide and 415 mm long) was formed therein. In addition, holes for the air suction having a diameter of 2 mm were formed in the supporting plate 230 with 20 mm pitch, and the supporting plate 230 was able to apply a suction force of 1 to 50 kPa to the base plate. A CCD camera having a resolution of 1 μm was used as the camera 266, and calculations for obtaining displacements and correction values were performed by an image processing unit. The air cylinder 236 of the disengaging unit 232 was supplied with compressed air in which the pressure was 0.5 MPa, and the engaging units were disengaged during the process of adjusting the positions of the deposition masks. In the completed integrated mask, displacements of the sixteen depositions masks were within 5 μm. Thus, an integrated mask having the desired accuracy was obtained.

Example 2

The integrated mask obtained in the Example 1 was attached to a mask holder in a deposition apparatus for forming a green emitting layer as an integrated mask for forming a green emitting layer. Then, another integrated mask was manufactured similarly to the Example 1 except that the positions of the apertures (100 μm wide and 64 mm long) formed in the mask plate were shifted by 100 μm (length corresponding to one pitch of the ITO electrodes), and was used as an integrated mask for forming a red emitting layer. In addition, another integrated mask was manufactured similarly to the Example 1 except that the positions of the apertures (100 μm wide and 64 μm long) formed in the mask plate were shifted by 200 μm (length corresponding to two pitches of the ITO electrodes), and was used as an integrated mask for forming a blue emitting layer.

Next, a 130 nm thick ITO transparent electrode layer was formed on the surface of a non-alkali glass substrate (1.1 mm thick, 436 mm wide, and 457 mm long) by sputtering. As shown in FIG. 10, the ITO transparent electrode layer was formed in a pattern including sixteen line arrays corresponding to sixteen organic EL devices. The line arrays were arranged with 109 mm pitch in the width direction of the substrate and with 110 mm pitch in the longitudinal direction of the substrate. As shown in FIG. 10, each line array 906 included a striped pattern 904 in which 816 lines (90 mm long and 80 μm wide) extending in the width direction of a glass substrate 902 were arranged in the longitudinal direction of the glass substrate 902 with 100 μm pitch.

Then, a 3 μm thick layer of positive photoresist (OFPR-80, manufactured by Tokyo Ohka Kogyo Co., Ltd.), was formed over the entire surface of the substrate A by spin coating. Then, the substrate was dried, and exposure using a photomask and development of the photoresist was performed, so that a predetermined pattern was formed. Then, a curing process was performed at 180° C. Accordingly, sixteen spacer units were formed on sixteen effective luminescent areas (areas including the ITO electrodes and R, G, and B emitting layers) of the sixteen organic EL devices. In each spacer unit, holes (space where spacer were not formed) having the size of 65 μm in the longitudinal direction of the substrate (direction perpendicular to the ITO electrodes) and 235 μm in the width direction of the substrate were formed. In each spacer unit, the holes were arranged in 816 lines in the longitudinal direction of the substrate with 100 μm pitch so that the ITO electrodes were exposed, each line including 200 holes aligned in the width direction of the substrate, that is, in the longitudinal direction of the ITO electrodes, with 300 μm pitch.

Next, a 15 nm thick copper phthalocyanine layer and a 60 nm thick bis(N-ethylcarbazole) layer were formed over the effective luminescent areas of the sixteen organic EL devices by deposition. Thus, a hole-transport layer was formed. The degree of vacuum during the deposition process was $2 \times 10^{-4}$ Pa or less, and the substrate was rotated relative to the evaporation source during the deposition.

Then, in order to form the emitting layer, the integrated mask 1 was disposed in the deposition apparatus 502 shown in FIG. 8, and the alignment marks were observed by the camera 530. Then, the glass substrate A, on which the hole-transport layer was formed, was placed on the substrate holder 522 by the transfer apparatus 600, and the vacuum pump was driven such that the degree of vacuum in the vacuum chamber 532 was set to $1 \times 10^{-4}$ Pa. Then, the substrate holder 522 was moved downward and the glass substrate A on the substrate holder 522 was placed on the integrated mask 1. This glass substrate A was provided with two alignment marks on a line 5 mm away from an end in the longitudinal direction, at positions symmetrical in the width direction with the distance of 30 mm therebetween. The alignment marks were formed of ITO transparent electrodes in a circular shape (1 mm in diameter). The relative position between the glass substrate A and the integrated mask 1 was adjusted such that the alignment marks of the glass substrate A and the alignment marks of the base plate 2 of the integrated mask 1 were at the same positions. After the positioning process, the glass substrate A was pressed against the integrated mask 1 by the pressing member 524 at 20 N. Then, the evaporation source 534 was heated, and 8-hydroxyquinoline-aluminum complex (Alq3) doped with 0.3 wt % 1,3,5,7,8-pentamethyl-4,4-difloro-4-bora-3a,4a-diaza-s-indacene (PM546) was deposited as a material for forming the green emitting layer in a pattern corresponding to the mask pattern of the integrated mask 1.

Then, the substrate A on which the green emitting layer was formed was taken out and was transferred to another deposition apparatus in which the integrated mask for forming a red emitting layer was disposed. Then, the relative position between the substrate A and the integrated mask was adjusted similarly to the above-described case in which the green emitting layer was formed. Then, Alq3 doped with 1 wt % 4-(dicyanomethylene)-2-methyl-6-(julolidinyl-9-ethenyl) pyran (DCJT) was deposited on the substrate A under the vacuum condition of $1\times 10^{-4}$ Pa, so that a 15 nm thick red emitting layer was formed. Then, the substrate A was transferred to another deposition apparatus in which the integrated mask for forming a blue emitting layer was disposed. Then, the relative position between the substrate A and the integrated mask was similarly adjusted, and 4,4,'-bis(2,2'diphenylvinyl)diphenyl (DPVBi) was deposited on the substrate A under the vacuum condition of $1\times 10^{-4}$ Pa, so that a 20 nm thick blue emitting layer was formed.

The R, G, and B emitting layers were formed on the ITO electrodes arranged in a striped pattern, so that the exposed parts of the ITO electrodes were completely covered.

Next, DPVBi was deposited at 45 nm and Alq3 was deposited at 10 nm over the effective luminescent areas of the sixteen organic EL devices. Thus, an electron-transport layer was formed. In addition, lithium was deposited at 0.5 nm in terms of the layer thickness, and was doped in the electron transfer layer. Then, 240 nm thick aluminum layer was formed on the substrate in a pattern including sixteen line arrays arranged with 109 mm pitch in the width direction of the substrate and with 110 mm in the longitudinal direction of the substrate, so that the above-described holes in the spacer were covered. Each line array included a striped pattern in which 200 aluminum lines (100 mm long and 250 μm wide) extending in the longitudinal direction of the substrate (direction perpendicular to the ITO substrates) were arranged in the width direction of the substrate with 300 μm pitch. The degree of vacuum during the deposition process was $3\times 10^{-4}$ Pa or less. Then, silicone monoxide was deposited at 200 nm as a protection layer by electron beam deposition.

The thus obtained substrate including sixteen EL devices was cut so that the sixteen EL devices were separated. In each EL device, thin film layers including a first electrode layer formed of 816 ITO electrodes arranged in a striped pattern, R, G, and B emitting layers formed on the first electrode layer, and a metal electrode layer formed of 200 metal electrodes arranged perpendicularly to the ITO electrodes in a striped pattern, were formed. In the intersections of the ITO electrodes and the metal electrodes, only the regions where the holes surrounded by the spacer were formed emitted light. In addition, one pixel was formed of three luminescent sub-pixels corresponding to three colors (R, G, and B). Accordingly, the passive matrix color organic EL device having 272×200 pixels with 300 μm pitch was manufactured.

All of the thus manufactured sixteen organic EL devices had the luminescence characteristics suitable to be used as a display. In addition, since the emitting layers were deposited using an integrated mask including a plurality of separated deposition masks, EL devices having the same dimensional accuracy and the same characteristics were obtained. In all of the sixteen organic EL devices, displacements between the R, G, and B emitting layers were within 15 μm. For the purpose of comparison, sixteen organic EL devices were manufactured using a deposition mask in which deposition patterns corresponding to sixteen organic EL devices were formed in a single plate. In this case, displacements between the R, G, and B emitting layers were 100 μm at a maximum, and only two organic EL devices could be practically used as a display.

Example 3

As shown in FIG. 3, a plate formed of Ni alloy (82 mm wide, 103 mm long, and 30 μm thick) was prepared as the mask plate 122 for forming an emitting layer. In addition, 256 rectangular apertures (100 μm wide and 62 mm long) were arranged with 300 μm pitch as the deposition apertures 132. The rectangular apertures were arranged such that the longitudinal direction thereof (the direction in which the dimension was 62 mm) was along the width direction of the plate (the direction in which the dimension was 82 mm). In order to prevent the apertures from being deformed, 20 μm wide reinforcing lines were formed in parallel to the width direction of the apertures with 300 μm pitch. Two cross-shaped alignment marks 126 were formed in the plate on a central line in the longitudinal direction of the plate, at positions symmetrical in the width direction of the plate with a distance of 68 mm therebetween. Similarly, sixteen mask plates in total were manufactured.

Each of the above-described mask plates was fixed to a frame 124 (82 mm wide and 103 mm long) formed of Kovar alloy using epoxy resin. Accordingly, sixteen deposition masks 120 in total were manufactured. In the frame, the thickness of a part at which the mask plate was fixed was 6 mm, and a two-step opening (the lower part was 70 mm wide and 97 mm long, and the upper part was 63 mm wide and 90 mm long) was formed at the central region thereof. In addition, two tabs 128 having the thickness of 2.5 mm were formed, one at each side of the frame in a diagonal direction.

Next, as shown in FIG. 4, a plate formed of Kovar alloy (420 mm wide, 456 mm long, and 12 mm thick) in which openings 110 (70 mm wide and 97 mm long) were formed was prepared as the base plate 102. The openings 110 were arranged in four lines in the width direction, starting at a position 19 mm from the top with 100 mm pitch, and in four lines in the longitudinal direction, starting at a position 10 mm from the left end with 111 mm pitch. Accordingly, sixteen (4×4, 4 ranks and 4 files) openings in total were formed in the base plate. Then, the above-described sixteen deposition masks were disposed on the base plate in such a manner that the openings in the deposition masks were aligned with the openings in the base plate. Then, the deposition masks were retained to the base plate using two engaging units 140 for each deposition mask, each engaging unit 140 including a pressing plate 142, a compressing spring 144, and a fulcrum 146. Accordingly, an integrated mask in which the positions of the deposition masks were roughly adjusted was manufactured. In the integrated mask, a glass plate (4 mm wide, 400 mm long, and 6 mm thick) was retained on the base plate at the central region thereof in such a manner that the longitudinal direction of the glass plate was along the width direction of the base plate. This glass plate was provided with two types of cross-shaped alignment marks formed of chromium: one type was formed as a cross two lines (20 μm wide and 100 μm long) and was used for positioning the deposition masks, and the other type was formed as a cross of two lines (60 μm wide and 180 μm long) and was used for positioning the substrate. The alignment marks of the first type were formed on a line 2 mm away from the left end of the glass plate in the width direction thereof, at positions symmetrical in the width direction with a distance of 68 mm. The alignment marks of the second type were formed on a line 2 mm away from the left end of the glass plate in the width direction thereof, at positions symmetrical in the width direction with a distance of 380 mm. The surface on which the alignment marks were formed and the top surface of the deposition masks were at the same height relative to the base plate. The engaging units 140 were formed of stainless steel, and the thickness of the pressing plate 142 was 3 mm.

Next, as shown in FIG. 7, the integrated mask 100 was placed on the supporting plate 404 of the integrated mask fabrication apparatus 400, and the positions of the sixteen deposition masks placed on the base plate were adjusted until the displacements of the alignment marks were reduced to 5 μm or less. In the integrated mask fabrication apparatus 400, the X-Y table 402 was able to move in the horizontal plane in steps of 1 μm, and the turntable 434 was able to rotate in steps of 0.001 degrees. The size of the supporting plate 404 was 500 mm×500 mm, and the base plate was retained using the pins 414. CCD cameras having a resolution of 1 μm were used as the cameras 470A and 470B, and calculations for obtaining displacements and correction values were performed by an image processing unit. In this Example, the positions of the deposition masks were adjusted while the deposition masks were clamped from both sides by the clamping pins 432. In the completed integrated mask, displacements of the sixteen deposition masks were within 5 μm.

Example 4

The integrated mask obtained in the Example 3 was attached to a mask holder in a deposition apparatus for forming a green emitting layer as an integrated mask for forming a green emitting layer. Then, another integrated mask was manufactured similarly to the Example 3 except that the positions of the apertures (100 μm wide and 62 mm long) formed in the mask plate were shifted by 100 μm (length corresponding to one pitch of the ITO electrodes), and was used as an integrated mask for forming a red emitting layer. In addition, another integrated mask was manufactured similarly to the Example 3 except that the positions of the apertures (100 μm wide and 62 mm long) formed in the mask plate were shifted by 200 μm (length corresponding to two pitches of the ITO electrodes), and was used as an integrated mask for forming a blue emitting layer.

Next, a 130 nm thick ITO transparent electrode layer was formed on the surface of a non-alkali glass substrate (1.1 mm thick, 400 mm wide, and 444 mm long) by sputtering. As shown in FIG. 10, the ITO transparent electrode layer was formed in a pattern including sixteen line arrays corresponding to sixteen organic EL devices. The line arrays were arranged with 100 mm pitch in the width direction of the substrate and with 111 mm pitch in the longitudinal direction of the substrate. As shown in FIG. 10, each line array 906 included a striped pattern 904 in which 768 lines (90 mm long and 80 μm wide) extending in the width direction of a glass substrate 902 were arranged in the longitudinal direction of the glass substrate 902 with 100 μm pitch.

Then, positive, photosensitive polyimide precursor (PW-1000, manufactured by Toray Industries, Inc.), of which the concentration was controlled, was applied over the entire surface of the substrate A by spin coating. Then, the substrate was dried, and exposure using a photomask and development of the polyimide precursor was performed, so that a predetermined pattern was formed. Then, a curing process was performed at 320° C. Accordingly, sixteen spacer units were formed on sixteen effective luminescent areas (areas including the ITO electrodes and R, G, and B emitting layers) of the sixteen organic EL devices. In each spacer unit, holes (space where spacer were not formed) having the size of 70 μm in the longitudinal direction of the substrate (direction perpendicular to the ITO electrodes) and 235 μm in the width direction of the substrate were formed. In each spacer unit, the holes were arranged in 768 lines in the longitudinal direction of the substrate with 100 μm pitch so that the ITO electrodes were exposed, each line including 200 holes aligned in the width direction of the substrate, that is, in the longitudinal direction of the ITO electrodes, with 300 μm pitch.

Then, a hole-transport layer was formed in a manner similar to the Example 2.

Then, in order to form the emitting layer, the integrated mask 100 was disposed in the deposition apparatus 502 shown in FIG. 8, and the alignment marks were observed by the camera 530. Then, the glass substrate A, on which the hole-transport layer was formed, was placed on the substrate holder 522 by the transfer apparatus 600, and the vacuum pump was driven such that the degree of vacuum in the vacuum chamber 532 was set to $1 \times 10^{-4}$ Pa. Then, the substrate holder 522 was moved downward and the glass substrate A on the substrate holder 522 was placed on the integrated mask 100. This glass substrate A was provided with two alignment marks on the central line in the longitudinal direction thereof, at positions symmetrical in the width direction thereof with a distance of 380 mm therebetween. The alignment marks were formed of ITO transparent electrodes in a circular shape (300 μm in diameter). The relative position between the glass substrate A and the integrated mask 100 was adjusted such that the alignment marks of the glass substrate A and the alignment marks of he base plate 2 of the integrated mask 100 were at the same positions. After the positioning process, the glass substrate A was pressed against the integrated mask 100 by the pressing member 524 at 20 N. Then, RGB emitting layers were formed similarly to the Example 2. Then, an electron-transport layer, lithium, a metal layer, and a protection layer were formed similarly to the Example 2.

The thus obtained substrate including sixteen EL devices was cut so that the sixteen EL devices were separated. In each EL device, thin film layers including a first electrode layer formed of 768 ITO electrodes arranged in a striped pattern, R, G, and B emitting layers formed on the first electrode layer, and a metal electrode layer formed of 200 metal electrodes arranged perpendicularly to the ITO electrodes in a striped pattern, were formed. In the intersections of the ITO electrodes and the metal electrodes, only the regions where the holes surrounded by the spacer were formed emitted light. In addition, one pixel was formed of three luminescent sub-pixels corresponding to three colors (R, G, and B). Accordingly, simple matrix color organic EL device having 256×200 pixels with 300 µm pitch was manufactured.

All of the thus manufactured sixteen organic EL devices had the luminescence characteristics suitable to be used as a display. In addition, since the emitting layers were deposited using an integrated mask including a plurality of separated deposition masks, EL devices having the same dimensional accuracy and the same characteristics were obtained. In all of the sixteen organic EL devices, displacements between the R, G, and B emitting layers were within 10 µm.

Example 5

As shown in FIG. 11, a plate formed of Ni alloy (182 mm wide, 214 mm long, and 30 µm thick) was prepared as a mask plate 172 for a deposition mask 170. In addition, four aperture array/alignment mark units 180, each of which included an aperture array 130 and alignment marks 126 similar to those described in the Example 3, were formed on the mask plate 172 in 2×2 matrix. Similarly, four mask plates in total were manufactured.

Each of the above-described mask plates was fixed to a frame 124 (182 mm wide and 214 mm long) formed of Kovar alloy using epoxy resin. Accordingly, four deposition masks in total were manufactured. In each frame, the thickness of a part at which the mask plate was fixed was 6 mm, and a two-step opening (the lower part was 170 mm wide and 208 mm long, and the upper part was 163 mm wide and 201 mm long) was formed at the central region thereof. In addition, as shown in FIG. 11, four tabs 178 having the thickness of 2.5 mm were formed, two at each side of the frame.

Next, as shown in FIG. 4, a plate formed of Kovar alloy (420 mm wide, 456 mm long, and 12 mm thick) in which four openings 110 (170 mm wide and 208 mm long) were formed in a 2×2 pattern was prepared as the base plate 102. Then, the above-described four deposition masks were disposed on the base plate in such a manner that the openings in the deposition masks were aligned with the openings in the base plate. Then, the deposition masks were retained to the base plate using two engaging units 140 for each deposition mask, each engaging unit 140 including a pressing plate 142, a compressing spring 144, and a fulcrum 146. Accordingly, an integrated mask in which the positions of the deposition masks were roughly adjusted was manufactured. A glass plate similar to that in the Example 3 was attached to the base plate.

Next, similarly to the Example 3, the integrated mask was placed on the supporting plate 404 of the integrated mask fabrication apparatus 400, and the positions of the four deposition masks placed on the base plate were adjusted until the displacements of the alignment marks were reduced to 5 µm or less. In the completed integrated mask, displacements of the four depositions masks were within 5 µM.

Example 6

Similarly to the Example 4, the passive matrix color organic EL devices having 256×200 pixels with 300 µm pitch was manufactured using the integrated mask obtained in the Example 5.

All of the thus manufactured sixteen organic EL devices had the luminescence characteristics suitable to be used as a display. In addition, since the emitting layers were deposited using an integrated mask including a plurality of separated deposition masks, EL devices having the same dimensional accuracy and the same characteristics were obtained. In all of the sixteen organic EL devices, displacements between the R, G, and B emitting layers were within 15 µm.

In the above-described Example 4, in order to form sixteen organic EL devices on a single substrate (n=16), the integrated mask having sixteen deposition masks (m=16), each of which has a single aperture array (k=1), was used. Therefore, the process of positioning the deposition mask was performed for sixteen times. In contrast, in the Example 6, in order to form sixteen organic EL devices on a single substrate (n=16), the integrated mask having four deposition masks (m=4), each of which has four aperture arrays (k=4), was used. Therefore, the process of positioning the deposition mask process was performed only for four times. Accordingly, the size of the deposition masks was increased without degrading the dimensional accuracy of thereof, and the efficiency of manufacturing the organic EL devices was increased while the degradation of the accuracy was suppressed.

In the above-described Examples, three integrated masks were used for forming R, G, and B emitting layers. However, a single integrated mask may also be used for forming all of the R, G, and B emitting layers by shifting the relative position between the integrated mask and the substrate by the amount corresponding to one pitch of the ITO electrodes. In addition, although the mask deposition method was used also in the process of forming the metal electrodes, the metal electrodes may also be formed without using the deposition mask. In such a case, walls (cathode separators) may be formed on the substrate in advance, and the metal electrodes may be formed by using the shadows of the walls. Furthermore, the substrate may also be encapsulated by a known technique after the deposition process.

Although passive matrix color organic EL devices were manufactured in the above-described Examples, monochrome organic EL devices may also be manufactured by omitting the processes of forming the emitting layers in a precise pattern. In addition, active matrix color organic EL devices may also be manufactured by using a substrate including switching devices such as thin film transistors (TFTs).

What is claimed is:

1. An organic EL device manufacturing method comprising the steps of:

(a) positioning an integrated mask and a single substrate to be subjected to a deposition process in a deposition chamber using a camera to observe alignment marks formed on said integrated mask and said single substrate, wherein said integrated mask comprises:

(a-1) a plurality of deposition masks each of which has an array of deposition apertures formed in accordance with a deposition pattern and alignment marks, (a-2) a base plate which has a plurality of openings on which said deposition masks are arranged respectively, each of said deposition masks being arranged over respective openings, and which has alignment marks, (a-3) a plurality of engaging units provided on said base plate each of which engages and disengages each of said deposition masks and said base plate by applying force to each of said deposition masks against the base plate such that the position of each deposition mask is adjusted relative to said base plate independently of the other deposition masks while each of said deposition masks is disengaged, and wherein said integrated masks is fabricated by the steps of:

(a-4) detecting said alignment marks of said base plate and each of said deposition masks using a camera, (a-5) adjusting the relative position between said base plate and each of said deposition masks prior to engaging the integrated mask with the substrate by independently retaining and independently moving each of said deposition masks relative to said base plate, and (a-6) retaining each of said deposition masks on said base plate using said engaging units after adjusting of said relative position; and (b) patterning a thin film layer in said deposition process using said integrated mask, thereby forming n said organic EL devices on said single substrate wherein n is an integer equal to or greater than 2.

2. An organic EL device manufacturing method according to claim 1, wherein said thin film is an emitting layer or a metal electrode layer.

* * * * *

UNITED STATES PATENT AND TRADEMARK OFFICE
CERTIFICATE OF CORRECTION

| | |
|---|---|
| PATENT NO. | : 7,396,558 B2 |
| APPLICATION NO. | : 10/055770 |
| DATED | : July 8, 2008 |
| INVENTOR(S) | : Fujimori et al. |

It is certified that error appears in the above-identified patent and that said Letters Patent is hereby corrected as shown below:

<u>In Column 4</u>
At line 23, after "view of", please insert -- the integrated mask shown in Fig. 1. In addition, Fig. 3 is a perspective view showing an over --.

Signed and Sealed this

Seventeenth Day of March, 2009

JOHN DOLL
*Acting Director of the United States Patent and Trademark Office*